(12) United States Patent
Bang et al.

(10) Patent No.: US 11,500,283 B2
(45) Date of Patent: Nov. 15, 2022

(54) MASK LAYOUT CORRECTION METHOD AND A METHOD FOR FABRICATING SEMICONDUCTOR DEVICES USING THE SAME

(71) Applicant: Samsung Electronics Co., Ltd., Suwon-si (KR)

(72) Inventors: Narae Bang, Seoul (KR); Sang-Hwa Lee, Seoul (KR); Noyoung Chung, Hwaseong-si (KR)

(73) Assignee: Samsung Electronics Co., Ltd.

( * ) Notice: Subject to any disclaimer, the term of this patent is extended or adjusted under 35 U.S.C. 154(b) by 287 days.

(21) Appl. No.: 16/939,828

(22) Filed: Jul. 27, 2020

(65) Prior Publication Data

US 2021/0063868 A1 Mar. 4, 2021

(30) Foreign Application Priority Data

Sep. 3, 2019 (KR) .......................... 10-2019-0109104

(51) Int. Cl.
*G03F 1/36* (2012.01)
*H01L 21/033* (2006.01)
*G03F 7/20* (2006.01)

(52) U.S. Cl.
CPC ................ *G03F 1/36* (2013.01); *G03F 7/705* (2013.01); *G03F 7/70441* (2013.01); *H01L 21/0337* (2013.01)

(58) Field of Classification Search
CPC .......... G03F 1/36; G03F 1/70; G03F 7/70441; G03F 7/705; G03F 7/70433; H01L 21/0271; H01L 21/0337; H01L 21/67259; H01L 21/682
See application file for complete search history.

(56) References Cited

U.S. PATENT DOCUMENTS

| | | | |
|---|---|---|---|
| 6,350,977 | B2 | 2/2002 | Taoka |
| 7,082,596 | B2 | 7/2006 | Liu |
| 7,434,199 | B2 | 10/2008 | Cobb et al. |
| 7,934,184 | B2 | 4/2011 | Zhang |

(Continued)

FOREIGN PATENT DOCUMENTS

| | | |
|---|---|---|
| CN | 108073047 A | 5/2018 |
| JP | 2007286918 A | 11/2007 |

(Continued)

*Primary Examiner* — Peter B Kim
(74) *Attorney, Agent, or Firm* — Myers Bigel, P.A.

(57) ABSTRACT

Disclosed are mask layout correction methods and a method for fabricating semiconductor devices. The mask layout correction method comprises performing a first optical proximity correction on an initial pattern layout. The step of performing the first optical proximity correction includes providing a target pattern of the initial pattern layout with control points based on a first model, obtaining a predicted contour of the initial pattern layout by performing a simulation, and obtaining an error between the target pattern and the predicted contour from the control points. The control points include first control points on an edge of the target pattern and second control points in an inside of the target pattern. The step of obtaining the error includes acquiring first error values from the first control points, providing weights to the first error values, and acquiring second error values from the second control points.

19 Claims, 12 Drawing Sheets

(56) References Cited

U.S. PATENT DOCUMENTS

| | | |
|---|---|---|
| 8,171,433 B2 | 5/2012 | Takahashi et al. |
| 8,195,697 B2 | 6/2012 | Maeda et al. |
| 8,473,878 B2 | 6/2013 | Chow et al. |
| 8,584,058 B2 | 11/2013 | Futrell et al. |
| 9,582,875 B2 | 2/2017 | Hirai et al. |
| 10,223,494 B2 | 3/2019 | Shin et al. |
| 2008/0189673 A1* | 8/2008 | Ying .................... G03F 1/36 716/52 |
| 2010/0030545 A1 | 2/2010 | Uno et al. |
| 2013/0125070 A1 | 5/2013 | Bai et al. |
| 2018/0011407 A1 | 1/2018 | Hsu |
| 2018/0267399 A1 | 9/2018 | Quaglio et al. |
| 2019/0163048 A1 | 5/2019 | Choi et al. |

FOREIGN PATENT DOCUMENTS

| | | |
|---|---|---|
| JP | 5470008 B2 | 4/2014 |
| KR | 10-0881514 B1 | 2/2009 |
| KR | 10-2015-0024500 A | 3/2015 |
| KR | 10-2019-0062026 A | 6/2019 |

\* cited by examiner

MASK LAYOUT CORRECTION METHOD AND A METHOD FOR FABRICATING SEMICONDUCTOR DEVICES USING THE SAME

REFERENCE TO PRIORITY APPLICATION

This U.S. nonprovisional application claims priority under 35 U.S.C § 119 to Korean Patent Application No. 10-2019-0109104, filed Sep. 3, 2019, the disclosure of which is hereby incorporated herein by reference in its entirety.

BACKGROUND

The present inventive concepts relate to mask layout correction methods and methods of fabricating semiconductor devices using the same.

A photomask may be used to print an integrated circuit layout on a wafer during a photolithography process, which is undertaken during fabrication of a semiconductor device. The photolithography process may generally involve transferring mask patterns formed on the photomask onto the substrate using one or more optical lenses. The photomask may include a transparent region(s) and an opaque region(s). The transparent region may be formed by etching a metal layer on the photomask and may allow light to pass therethrough. In contrast, the opaque region may not be transparent to light. The transparent and opaque regions may form the mask patterns. Light emitted from a light source may be irradiated through the mask patterns of the photomask to the wafer, and thus, the integrated circuit layout may be printed on the wafer.

As the integration of semiconductor process increases, a distance between the mask patterns of the photomask may become considerably narrower. This close proximity may induce light interference and diffraction which distorts the layout printed on the wafer. Resolution enhancement technology, such as optical proximity correction, may be used in an attempt to prevent this distortion. According to optical proximity correction methods, it may be possible to predict a degree of distortion such as light interference and diffraction. Furthermore, mask patterns to be formed on the photomask may be corrected based on predicted results. Accordingly, a desired layout may be printed on the wafer.

SUMMARY

Some example embodiments of the present inventive concepts provide a mask layout correction method capable of minimizing distortion of layouts.

Some example embodiments of the present inventive concepts provide methods for fabricating semiconductor devices, which are capable of minimizing defects of patterns that are formed on a wafer by a single exposure process.

According to some example embodiments of the present inventive concepts, a mask layout correction method may include performing a first optical proximity correction on an initial pattern layout. The step of performing the first optical proximity correction may include: (i) providing a target pattern of the initial pattern layout with a plurality of control points based on a first model; (ii) performing a simulation to obtain a predicted contour of the initial pattern layout; and (iii) obtaining from the plurality of control points an error between the target pattern and the predicted contour. The plurality of control points may include first control points provided on an edge of the target pattern, and second control points provided within an interior of the target pattern. The step of obtaining the error between the target pattern and the predicted contour may include: (i) acquiring first error values from the first control points, (ii) providing weights to the first error values, and (iii) acquiring second error values from the second control points.

According to some further embodiments of the present inventive concepts, a semiconductor fabrication method may including correcting a designed mask layout, manufacturing a photomask that has mask patterns corresponding to the corrected mask layout, and performing on a wafer a photolithography process that uses the photomask. The step of correcting the designed mask layout may include selecting an initial pattern layout from an integrated circuit design layout, determining whether the initial pattern layout coincides with specific type pattern layouts that are stored in advance in a pattern distortion library of a computer, and selectively performing a first optical proximity correction on the initial pattern layout only when the initial pattern layout coincides with the specific type pattern layouts.

According to additional embodiments of the present inventive concepts, a mask layout correction method may include selecting an initial pattern layout from an integrated circuit design layout, determining whether the initial pattern layout coincides with specific type pattern layouts (e.g., layouts that are stored in advance in a pattern distortion library of a computer), and performing a first optical proximity correction on the initial pattern layout only when the initial pattern layout coincides with the specific type pattern layouts. The step of performing the first optical proximity correction may include: (i) providing a target pattern of the initial pattern layout with a plurality of control points based on a first model; (ii) performing a simulation to obtain a predicted contour of the initial pattern layout, and (iii) obtaining from the plurality of control points an error between the target pattern and the predicted contour. The plurality of control points may include first control points provided on an edge of the target pattern; and second control points provided in an inside of the target pattern. The step of obtaining the error between the target pattern and the predicted contour may include acquiring first error values from the first control points, and providing weights to the first error values.

DETAILED DESCRIPTION OF EMBODIMENTS

The following will now describe in detail some example embodiments of the present inventive concepts in conjunction with the accompanying drawings.

Figure 1:
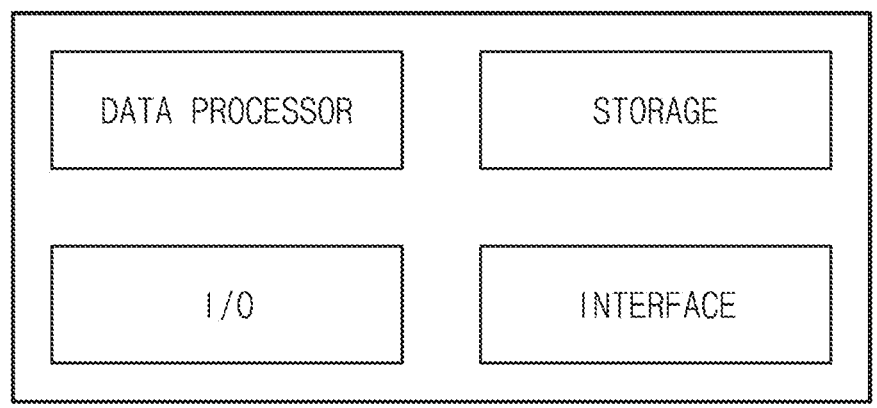
FIG. 1 illustrates a simplified schematic block diagram showing a computer system for performing a mask layout correction method according to some example embodiments of the present inventive concepts.

FIG. 1 illustrates a simplified schematic block diagram showing a computer system for performing a mask layout correction method according to some example embodiments of the present inventive concepts. Referring to FIG. 1, a computer system 1000 may include a data processor that processes various data, a storage that stores various data, an input/output (I/O) network, and an interface. The storage may store an integrated circuit design layout that is designed in advance for fabricating a semiconductor integrated circuit, and may also store various data that have been processed in the data processor. The data processor may include a simulation tool that corrects pattern layouts of the integrated circuit layout. The input/output may include a keyboard, a keypad, and/or a display device. Various data provided from external sources may be transferred to the computer system 1000 through the interface, and various data processed by the computer system 1000 may also be transferred to external destinations through the interface. The interface may include a wired element, a wireless element, and/or a universal serial bus (USB) port. A data bus may connect the data processor, the storage, the input/output, and the interface to each other.

Figure 2:
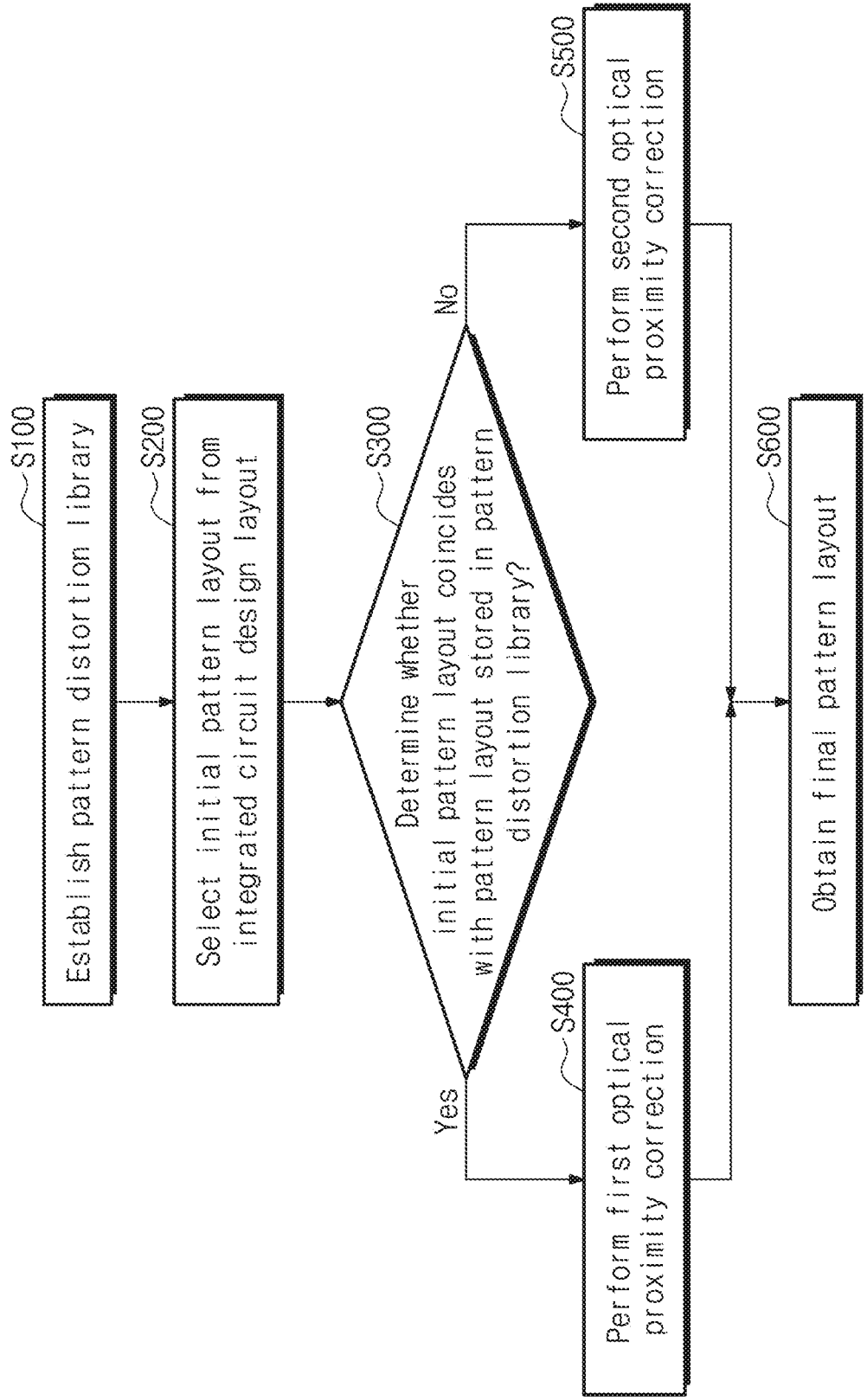
FIG. 2 illustrates a flow chart showing a mask layout correction method according to some example embodiments of the present inventive concepts.
Figure 3:
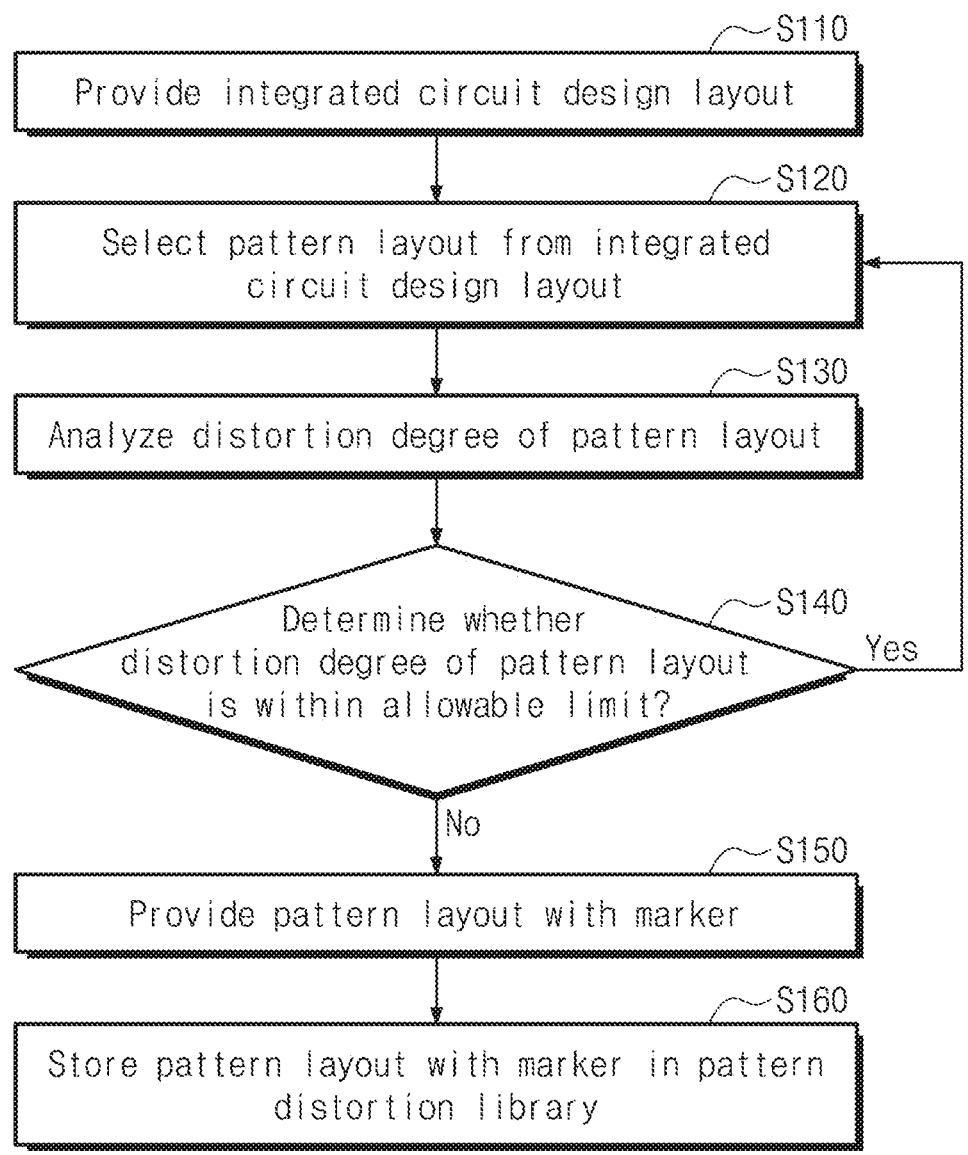
FIG. 3 illustrates a flow chart showing a step S100 of FIG. 2.
Figure 4:
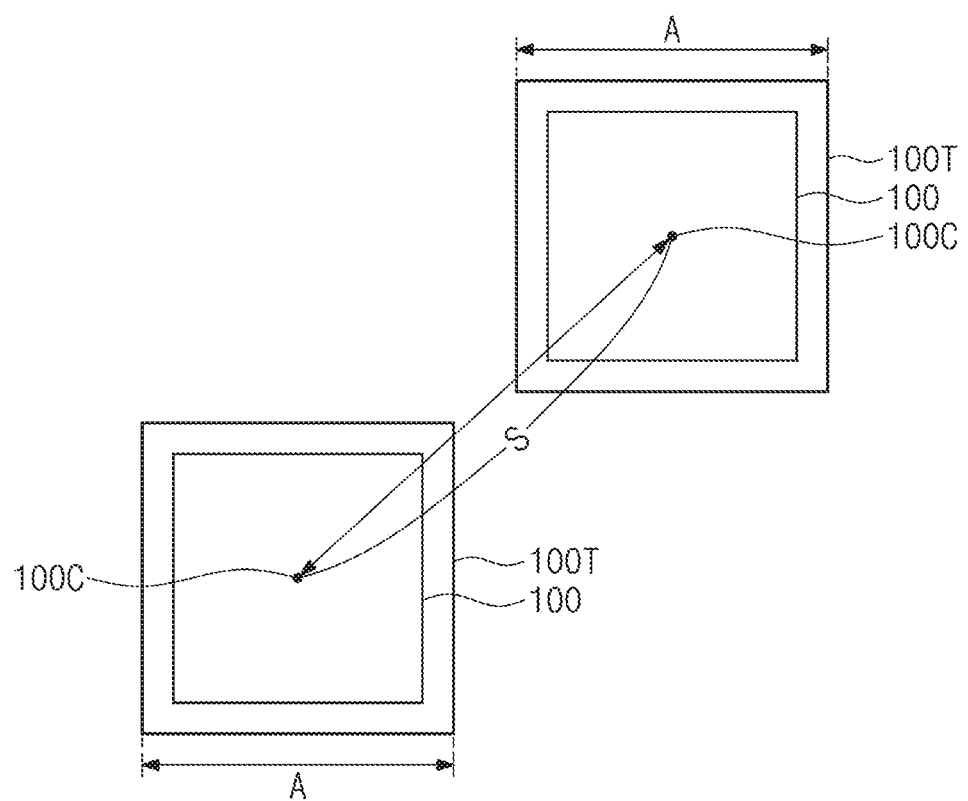
FIGS. 4 to 6 illustrate conceptual views showing a step S100 of FIG. 2.
Figure 5:
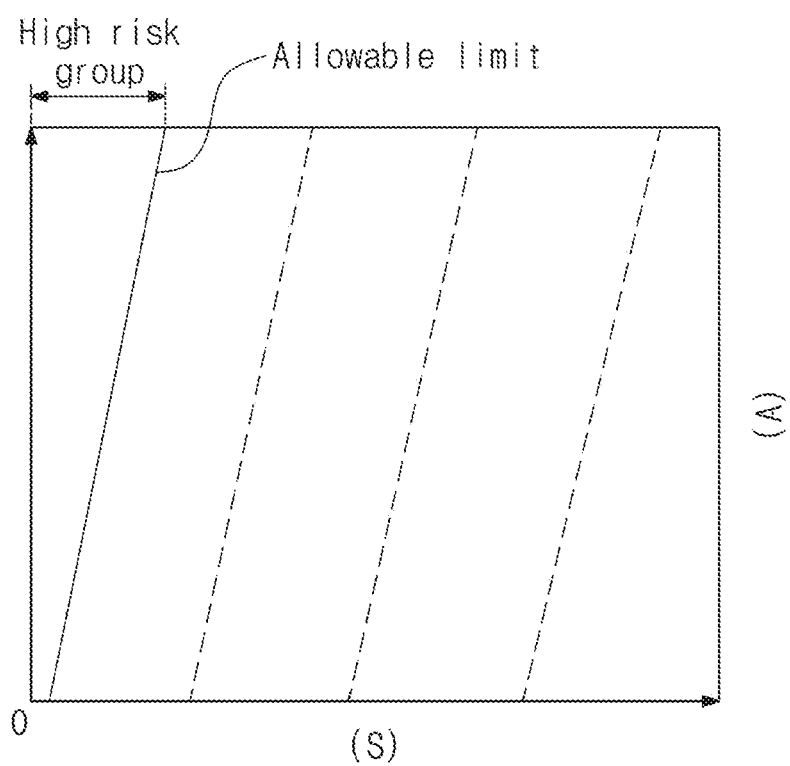
Figure 6:
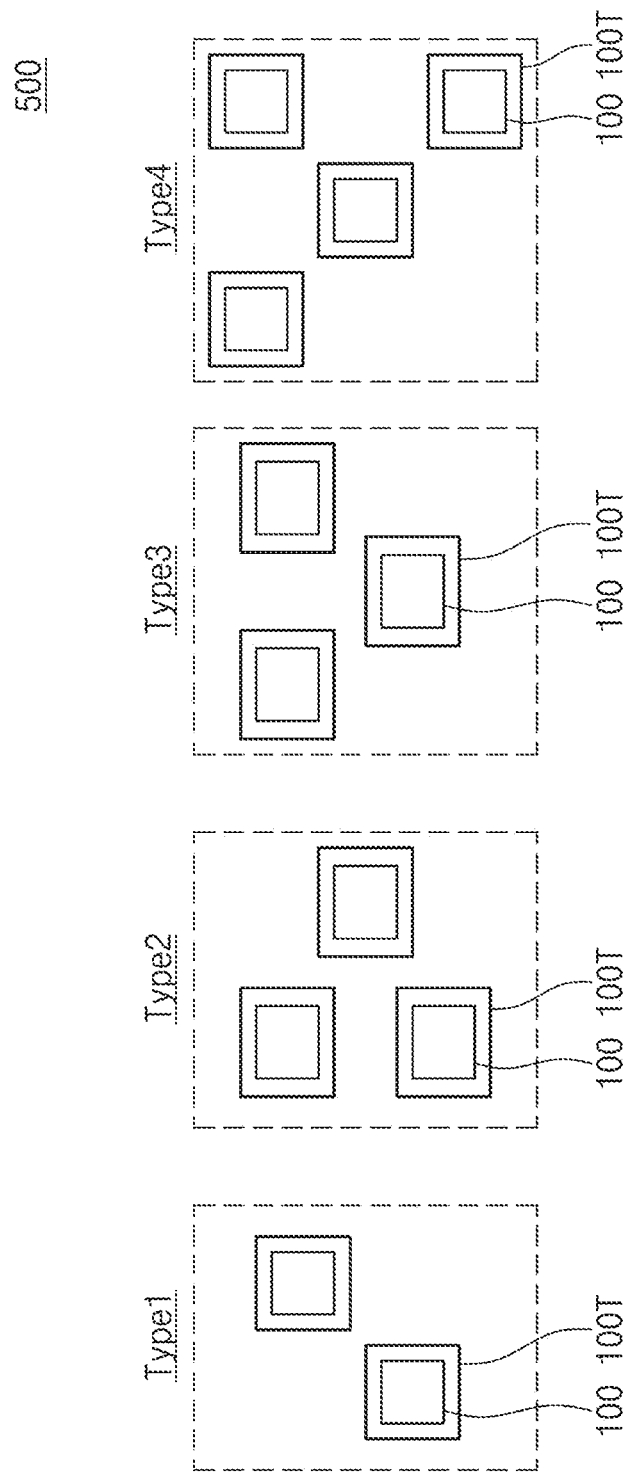

FIG. 2 illustrates a flow chart showing a mask layout correction method according to some example embodiments of the present inventive concepts. FIG. 3 illustrates a flow chart showing a step S100 of FIG. 2. FIGS. 4 to 6 illustrate conceptual views showing a step S100 of FIG. 2. Referring to FIG. 2, a pattern distortion library (see 500 of FIG. 6) may be established in the storage of the computer system 1000 (S100). For example, referring to FIGS. 3 and 4, an integrated circuit design layout may be provided (S110). The integrated circuit design layout may include pattern layouts that define planar shapes of patterns which will be formed on a wafer, and may be expressed by an appropriate data format (e.g., GDS II). The integrated circuit design layout may be stored in advance in the storage of the computer system 1000.

A pattern layout 100 may be arbitrarily selected from the integrated circuit design layout (S120). The pattern layout 100 may determine a target pattern 100T which will be printed on the wafer. When a distance between neighboring pattern layouts 100 is relatively small, the pattern layout 100 may be printed on the wafer with a distorted shape differently from the target pattern 100T.

Referring to FIGS. 3 to 5, an analysis may be executed to evaluate the degree of distortion of the pattern layout 100 (S130). For example, the analysis of the distortion degree of the pattern layout 100 may include using a specific function F to quantitatively analyze the distortion degree of the pattern layout 100. A distance S between central points 100C of neighboring pattern layouts 100 and an area A of the target pattern 100T may be referred to as variables of the specific function F expressed by Equation 1, below.

$$F(S,A)=a(1/S)*bA \quad \text{Equation 1:}$$

In Equation 1, S denotes a distance between the central points 100C of neighboring pattern layouts 100, and A indicates an area of the target pattern 100T determined by the pattern layout 100. In Equation 1, the terms "a" and "b" are proportional constants that are determined in advance.

The distortion degree of the pattern layout 100 may be inversely proportional to the distance S between the central points 100C of neighboring pattern layouts 100 and may be proportional to the area A of the target pattern 100T. For example, as the distance S between the central points 100C of neighboring pattern layouts 100 is smaller, and as the area A of the target pattern 100T is greater, the distortion degree of the pattern layout 100 may increase.

The specific function F may quantitatively analyze the distortion degree of the pattern layout 100. As shown in FIG. 5, the distortion degree of the pattern layout 100 may be expressed by a numerical value obtained from the specific function F. When the numerical value expressing the distortion degree of the pattern layout 100 is out of an allowable limit, the pattern layout 100 may be classified into a high risk group.

According to some embodiments, the distortion degree of the pattern layout 100 may be analyzed based on EDS test results (e.g., yield) of a wafer on which a semiconductor integrated circuit is formed. In this case, when the pattern layout 100 corresponds to a defect pattern of patterns formed on the wafer, the pattern layout 100 may be classified into the high risk group.

It may be determined whether or not the distortion degree of the pattern layout 100 is within the allowable limit (S140). When the distortion degree of the pattern layout 100 is out of the allowable limit (e.g., when the pattern layout 100 is classified into a high risk group of FIG. 5), the pattern layout 100 may be provided with a marker (S150). When the distortion degree of the pattern layout 100 is within the allowable limit (e.g., when the pattern layout 100 is classified into a certain group other than the high risk group of FIG. 5), the steps S120 to S140 of FIG. 3 may be repeatedly performed. For example, an additional pattern layout may be selected from the integrated circuit design layout (S120). An analysis may be executed to evaluate the degree of distortion of the additional pattern layout (S130), and then it may be determined whether or not the distortion degree of the additional pattern layout is within the allowable limit (S140).

Referring to FIGS. 3 and 6, the pattern layout 100 provided with the marker may be stored in the pattern distortion library 500 (S160). The pattern distortion library 500 may be established in the storage of the computer system 1000. The steps S120 to S160 of FIG. 3 may be repeatedly performed on each of the pattern layouts in the integrated circuit design layout. The data processor of the computer system 1000 may be configured to perform the steps S120 to S160 of FIG. 3.

The pattern distortion library 500 may store various type pattern layouts provided with the marker. For example, a first type pattern layout Type1 may include two neighboring pattern layouts 100 and may have a structure in which a neighboring pattern layout 100 is disposed close to a corner of the pattern layout 100. A second type pattern layout Type2 may include three neighboring pattern layouts 100 and may have a structure in which two neighboring pattern layouts 100 are disposed close to opposite corners of a short side of the pattern layout 100. A third type pattern layout Type3 may include three neighboring pattern layouts 100 and may have a structure in which two neighboring pattern layouts 100 are disposed close to opposite corners of a long side of the pattern layout 100. A fourth type pattern layout Type4 may include four neighboring pattern layouts 100 and may have a structure in which three neighboring pattern layouts 100 are disposed close to corresponding corners of the pattern layout 100.

Figure 7:
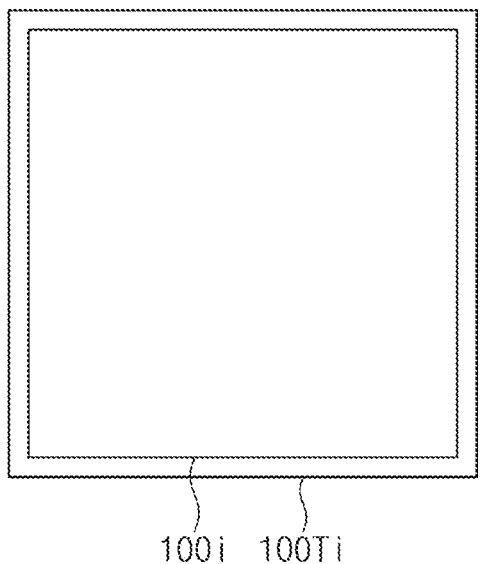
FIG. 7 illustrates a conceptual view showing a step S200 of FIG. 2.
Figure 8:
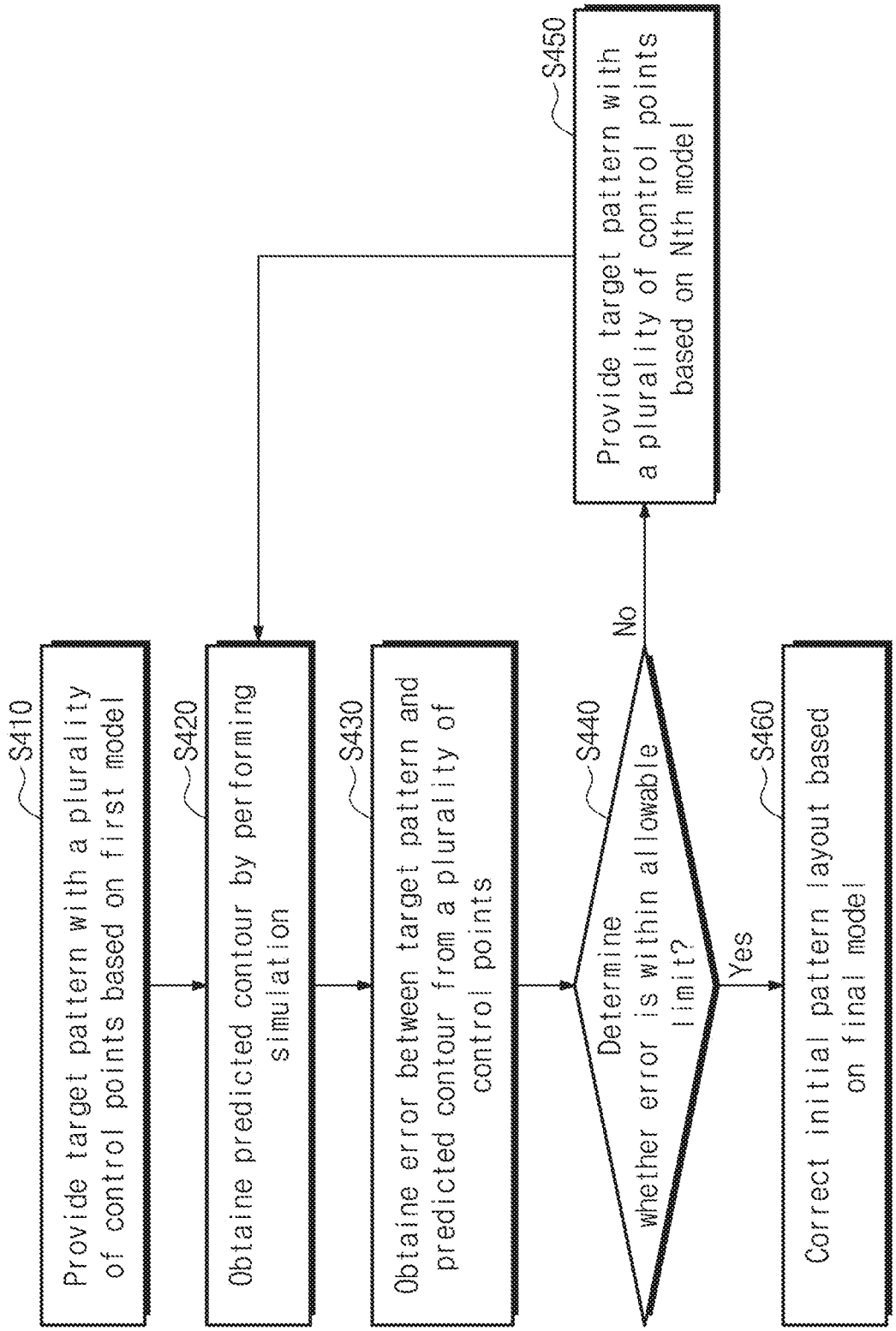
FIG. 8 illustrates a flow chart showing a step S400 of FIG. 2.
Figure 9:
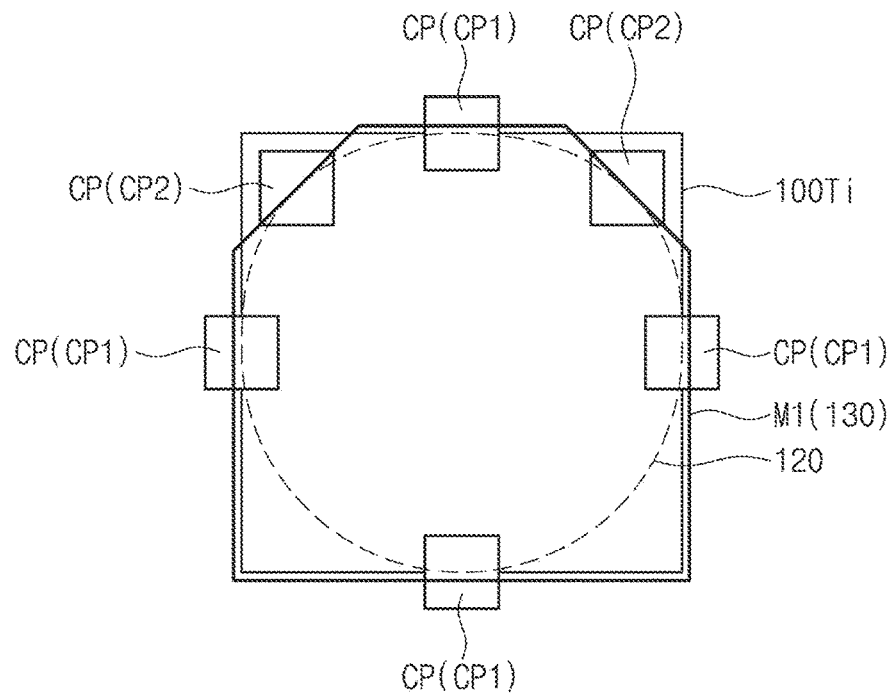
FIGS. 9 to 11 illustrate conceptual views showing a step S400 of FIG. 2.
Figure 10:
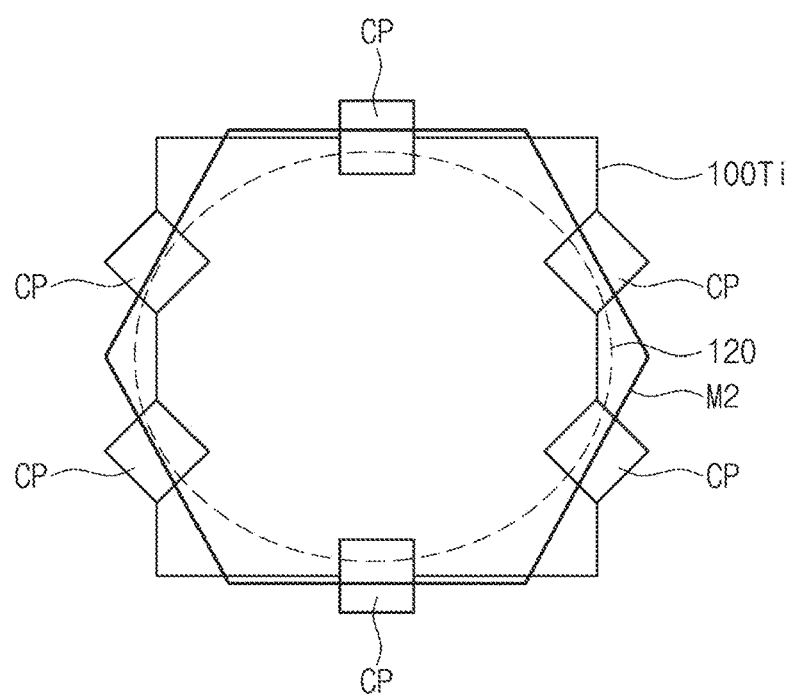
Figure 11:
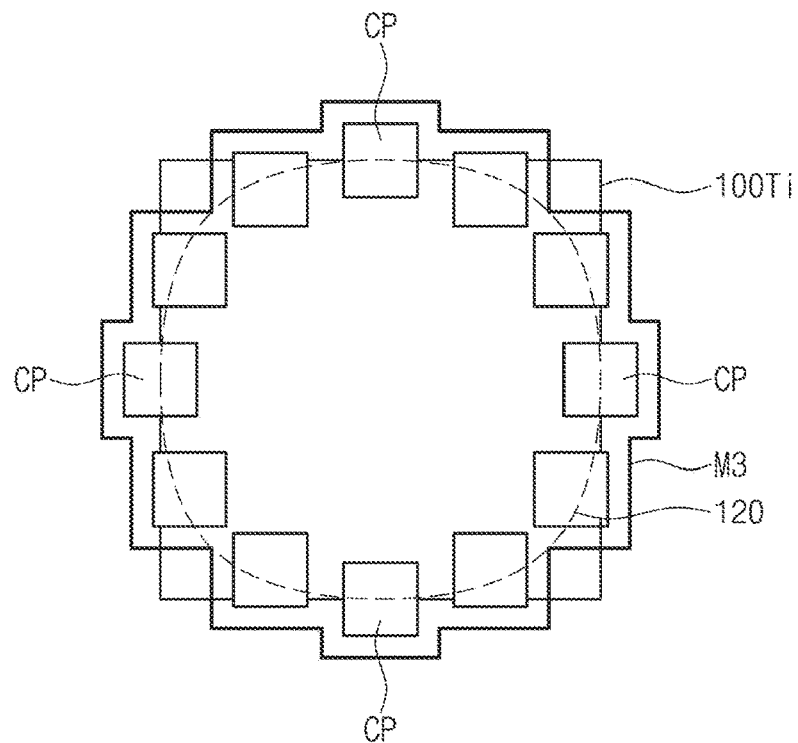
Figure 12:
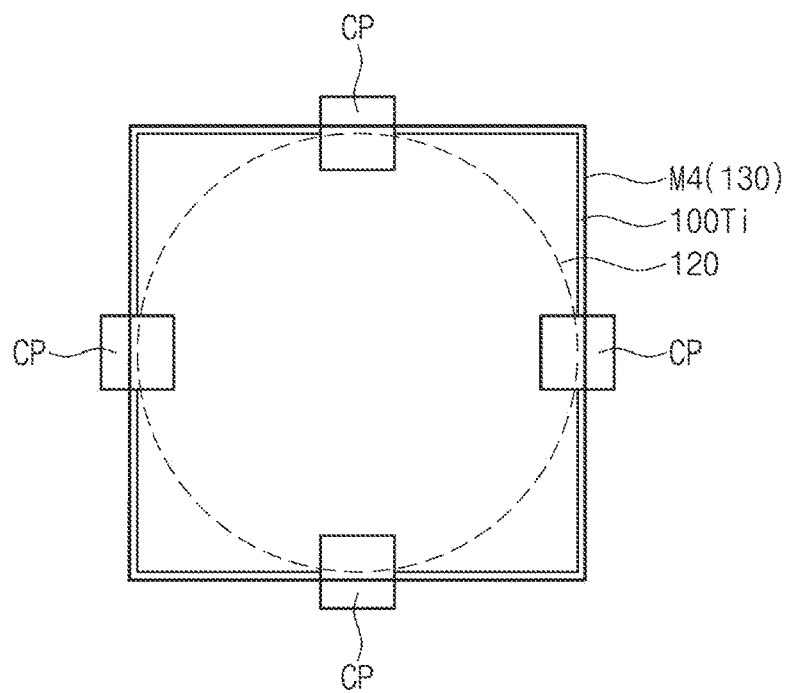
FIG. 12 illustrates a conceptual view showing a step S500 of FIG. 2.

FIG. 7 illustrates a conceptual view showing a step S200 of FIG. 2. FIG. 8 illustrates a flow chart showing a step S400 of FIG. 2. FIGS. 9 to 11 illustrate conceptual views showing a step S400 of FIG. 2. FIG. 12 illustrates a conceptual view showing a step S500 of FIG. 2.

Referring to FIGS. 2 and 7, an initial pattern layout 100*i* may be selected from the integrated circuit design layout (S200). The initial pattern layout 100*i* may indicate a pattern layout that is designed by a designer without performing optical proximity correction. The initial pattern layout 100*i* may determine a target pattern 100Ti which will be printed on the wafer.

It may be determined whether or not the initial pattern layout 100*i* coincides with the pattern layout 100 stored in the pattern distortion library 500 (S300). When the initial pattern layout 100*i* coincides with one of the first to fourth type pattern layouts 100 stored in the pattern distortion library 500, a first optical proximity correction may be performed on the initial pattern layout 100*i* (S400). When the initial pattern layout 100*i* does not coincide with one of the first to fourth type pattern layouts 100 stored in the pattern distortion library 500, a second optical proximity correction may be performed on the initial pattern layout 100*i* (S500). The data processor of the computer system 1000 may be configured to perform the steps S200 to 500 of FIG. 2.

For example, referring to FIGS. 8 and 9, the performing of the first optical proximity correction may include providing the target pattern 100Ti of the initial pattern layout 100*i* with a plurality of control points CP based on a first model M1 (S410). The first model M1 may be selected depending on a type of the initial pattern layout 100*i*. For example, when the initial pattern layout 100*i* coincides with the third type pattern layout Type3 shown in FIG. 6, bridge defects may occur between the target pattern 100Ti of the initial pattern layout 100*i* and the target patterns 100T of the pattern layouts 100 adjacent to the target pattern 100Ti. In this case, for minimizing the bridge defects, the first model M1 may have a corner-chop shape, and the plurality of control points CP may be arranged to correspond to the shape of the first model M1.

A lithography simulation may be performed on the initial pattern layout 100*i*, and as a result of the simulation, it may be possible to obtain a predicted contour 120 with respect to the initial pattern layout 100*i* (S420). An error between the target pattern 100Ti and the predicted contour 120 may be obtained from the plurality of control points CP (S430). For example, the plurality of control points CP may include first control points CP1 provided on an edge of the target pattern 100Ti and second control points CP2 provided in an inside of the target pattern 100Ti. A first cost function CF1 may be allocated to the first control points CP1, and a second cost function CF2 may be allocated to the second control points CP2. The first and second cost functions CF1 and CF2 may be respectively expressed by Equations 2 and 3 below.

$$CF1=P*EPE1 \qquad \text{Equation 2:}$$

$$CF2=EPE2 \qquad \text{Equation 3:}$$

In Equations 2 and 3, EPE1 is defined as a value that indicates the degree of deviation of the predicted contour 120 from the target pattern 100Ti at the first control points CP1, and EPE2 is defined as a value that indicates the degree of deviation of the predicted contour 120 from the target pattern 100Ti at the second control points CP2. The term P denotes a constant to provide a weight.

The obtaining of the error between the target pattern 100Ti and the predicted contour 120 may be achieved based on the first cost function CF1 allocated to the first control points CP1 and the second cost function CF2 allocated to the second control points CP2. For example, the obtaining of the error between the target pattern 100Ti and the predicted contour 120 may including acquiring first error values EPE1 from the first control points CP1, providing the weights P to the first error values EPE1, acquiring second error values EPE2 from the second control points CP2, and regarding a sum of weight-added first error values P*EPE1 and the second error values EPE2 as the error between the target pattern 100Ti and the predicted contour 120. Thus, the error between the target pattern 100Ti and the predicted contour 120 may be obtained using a total cost function expressed by Equation 4 below.

$$CFtotal=CF1+CF2=P*EPE1+EPE2 \qquad \text{Equation 4:}$$

It may be determined whether or not the error between the target pattern 100Ti and the predicted contour 120 is within the allowable limit (S440). For example, referring to FIGS. 8 and 10, when the error is out of the allowable limit, the target pattern 100Ti may be provided thereon with a plurality of control points CP based on a second model M2 (S450). The number of the plurality of control points CP based on the second model M2 may be greater than that of the plurality of control points CP based on the first model M1. For example, when the initial pattern layout 100*i* coincides with the third type pattern layout Type3 shown in FIG. 6, the second model M2 may have a hexagonal shape, and the plurality of control points CP may be arranged to correspond to the shape of the second model M2. Afterwards, the steps S420 to S440 of FIG. 8 may be repeatedly performed.

For another example, referring to FIGS. 8 and 11, when the error is out of the allowable limit, the target pattern 100Ti may be provided thereon with a plurality of control points CP based on a third model M3 (S450). The number of the plurality of control points CP based on the third model M3 may be greater than that of the plurality of control points CP based on the first model M1 and that of the plurality of control points CP based on the second model M2. For example, when the initial pattern layout 100*i* coincides with the third type pattern layout Type3 shown in FIG. 6, the third model M3 may have a fragment shape, and the plurality of control points CP may be arranged to correspond to the shape of the third model M3. Afterwards, the steps S420 to S440 of FIG. 8 may be repeatedly performed. The steps S410 to S450 of FIG. 8 may be repeatedly performed until the error between the target pattern 100Ti and the predicted contour 120 becomes minimal.

Referring back to FIGS. 8 and 9, when the error between the target pattern 100Ti and the predicted contour 120 is within the allowable limit, the initial pattern layout 100*i* may be corrected based on a final model (S460). The initial pattern layout 100*i* may be corrected to satisfy mask rule check (MRC). When the final model is the first model M1, a corrected pattern layout 130 may have substantially the same shape (e.g., corner-chop shape) as that of the first model M1.

Referring back to FIGS. 2 and 7, only when the initial pattern layout 100*i* coincides with one of the first to fourth type pattern layouts 100 stored in the pattern distortion library 500, the first optical proximity correction may be selectively performed on the initial pattern layout 100i. When the initial pattern layout 100i does not coincide with one of the first to fourth type pattern layouts 100 stored in the pattern distortion library 500, the second optical proximity correction may be performed on the initial pattern layout 100i.

For example, referring to FIG. 12, the performing of the second optical proximity correction may include providing the target pattern 100Ti of the initial pattern layout 100i with a plurality of control points CP based on a fourth model M4. The fourth model M4 may be selected depending on a type of the initial pattern layout 100i. For example, the fourth model M4 may have a rectangular shape, and the plurality of control points CP may be arranged to correspond to the shape of the fourth model M4. The plurality of control points CP may be provided only on an edge of the target pattern 100Ti. A cost function CF allocated to the plurality of control points CP may be expressed by Equation 5 below.

$$CF=EPE \qquad \text{Equation 5:}$$

In Equation 5, EPE is defined as a value that indicates the degree of deviation of the predicted contour 120 from the target pattern 100Ti at the plurality of control points CP. An error between the target pattern 100Ti and the predicted contour 120 may be obtained based on the cost function CF, and the initial pattern layout 100i may be corrected to minimize the error. The initial pattern layout 100i may be corrected to satisfy mask rule check (MRC). A corrected pattern layout 130 may have substantially the same shape (e.g., rectangular shape) as that of the fourth model M4.

Returning to FIG. 2, based on a type of the initial pattern layout 100i, one of the first and second optical proximity corrections may be selectively performed to obtain a final pattern layout (S600). The initial pattern layout 100i may be corrected according to the method discussed with reference to FIGS. 8 to 12, and thus the final pattern layout may be obtained. For example, the final pattern layout may correspond to the corrected pattern layout 130.

Figure 13:
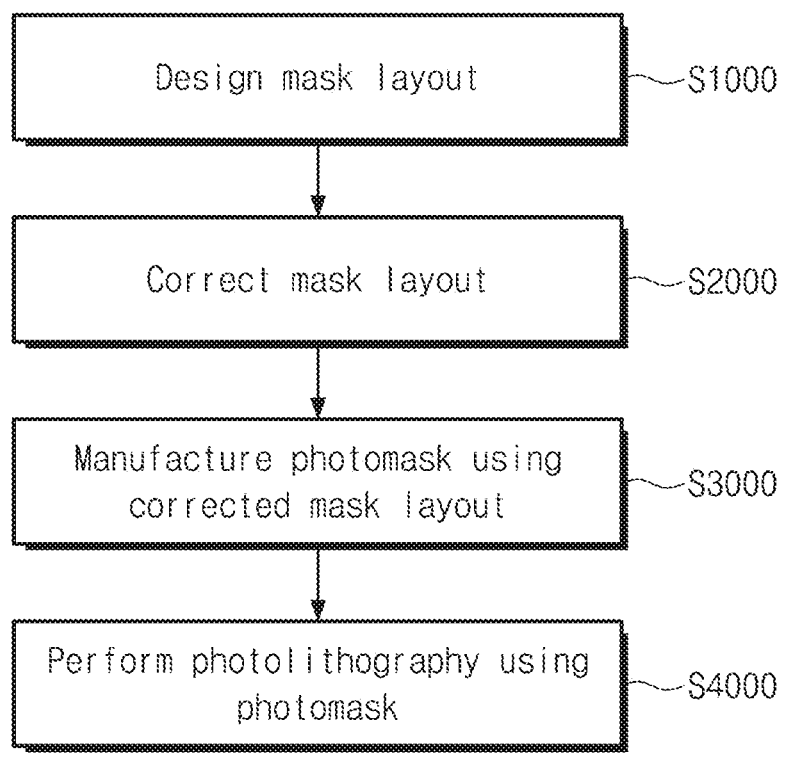
FIG. 13 illustrates a flow chart showing a method for fabricating semiconductor devices using a mask layout correction method according to some example embodiments of the present inventive concepts.
Figure 14:
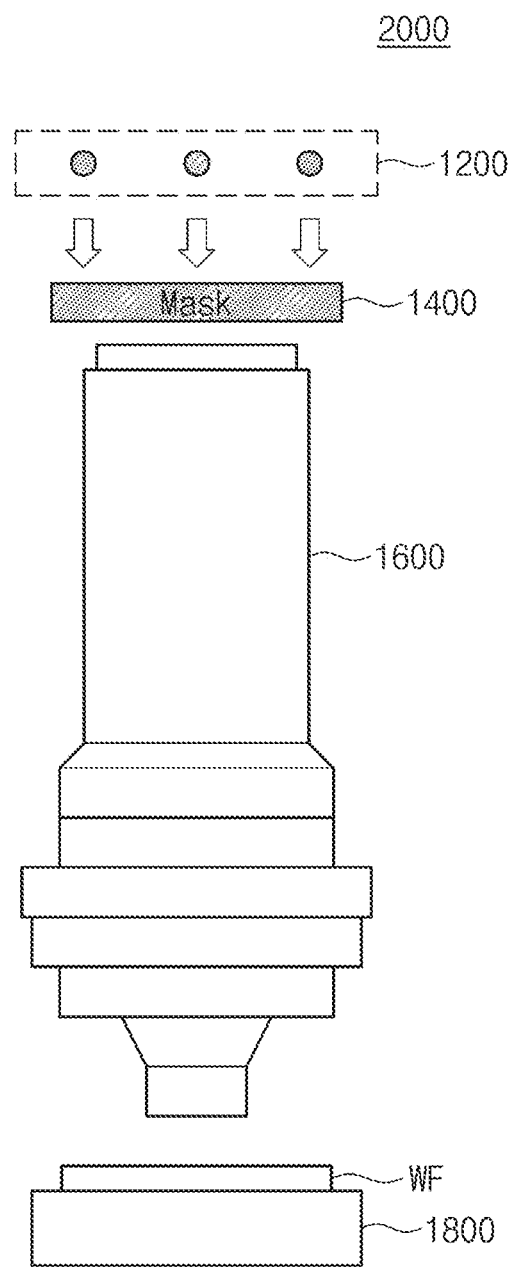
FIG. 14 illustrates a conceptual view showing a photolithography system used for fabricating semiconductor devices according to some example embodiments of the present inventive concepts.

FIG. 13 illustrates a flow chart showing a semiconductor fabrication method using a mask layout correction method according to some example embodiments of the present inventive concepts. FIG. 14 illustrates a conceptual view showing a photolithography system used for semiconductor fabrication according to some example embodiments of the present inventive concepts. Referring to FIG. 13, a mask layout may be designed (S1000). The design of the mask layout may be performed using an electronic design automation (EDA) software. The mask layout may correspond to the integrated circuit design layout that is provided at the step S200 of FIG. 2. The mask layout may include pattern layouts that are required for printing an integrated circuit on a wafer. The mask layout may be corrected (S2000). The mask layout may be corrected with the mask layout correction method discussed with reference to FIGS. 2 to 12.

The corrected mask layout may be used to manufacture a photomask (S3000). The manufacturing of the photomask may include providing a quartz substrate with a blank mask where a metal layer and a photosensitive layer are formed, transferring the corrected mask layout onto the photosensitive layer of the blank mask, developing the photosensitive layer to form photosensitive patterns that include patterns corresponding to the corrected mask layout, and performing an etching process in which the photosensitive patterns are used as an etching mask to etch the metal layer (e.g., a chromium layer) of the blank mask. The etching process may cause the photomask to include mask patterns corresponding to the corrected mask layout.

Referring to FIGS. 13 and 14, a photolithography process may be performed which uses the photomask (S4000). The photolithography process may be performed such that a wafer WF may be printed thereon with patterns corresponding to the mask patterns of the photomask. A photolithography system 2000 may be used to perform the photolithography process. The photolithography system 2000 may include a light source 1200, a photomask 1400, a reduction projection apparatus 1600, and a wafer stage 1800.

The light source 1200 may emit light. The light emitted from the light source 1200 may be irradiated to the photomask 1400. For example, the light source 1200 and the photomask 1400 may be provided therebetween with a lens to adjust a focus of the light. The light source 1200 may include an ultraviolet ray source.

The photomask 1400 may include the mask patterns used to print an integrated circuit layout on the wafer W. The photomask 1400 may include a transparent region and an opaque region, which regions may form the mask patterns. The transparent region, as discussed above, may be formed by etching a metal layer on the photomask 1400. The transparent region may be transparent to the light emitted from the light source 1200. In contrast, the opaque region may not allow light to pass therethrough, but may block the light.

The reduction projection apparatus 1600 may receive light that has passed through the transparent region of the photomask 1400. The reduction projection apparatus 1600 may match the mask patterns of the photomask 1400 with circuit patterns of a layout to be printed on the wafer WF. The wafer stage 1800 may support the wafer WF.

For example, the reduction projection apparatus 1600 may include an aperture. The aperture may be used to increase the depth of focus of an ultraviolet ray emitted from the light source 1200. For example, the aperture may include a dipole aperture or a quadruple aperture. The reduction projection apparatus 1600 may further include a lens for adjusting the focus of light.

Light passing through the transparent region of the photomask 1400 may be irradiated through the reduction projection apparatus 1600 to the wafer WF. The wafer WF may thus be printed thereon with patterns that correspond to the mask patterns of the photomask 1400.

Thereafter, subsequent processes may be performed to fabricate a semiconductor device, and as a result, the semiconductor device may be fabricated on the wafer WF.

According to the present inventive concepts, because the distortion degree of the pattern layout 100 is quantitatively analyzed through the specific function, the pattern distortion library 500 may be established. Only when the initial pattern layout 100i coincides with the pattern layout 100 in the pattern distortion library 500, the first optical proximity correction may be selectively performed. In this case, it may be possible to reduce the time required for correcting the initial pattern layout 100i.

In addition, when the first optical proximity correction is performed, the error between the target pattern 100Ti and the predicted contour 120 may be obtained using a cost function that provides weights to the first error values EPE1 of the first control points CP1 provided on an edge of the target pattern 100Ti. In this case, the initial pattern layout 100i may be corrected to minimize distortion of the initial pattern layout 100i.

Furthermore, the corrected pattern layouts may be used to manufacture a photomask, and the photomask may have mask patterns that correspond to the corrected pattern layouts. The corrected pattern layouts may have a shape to minimize distortion of a layout, and therefore, it may be possible to minimize failure of patterns on a wafer that are formed in a single exposure process.

According to the present inventive concepts, it may be possible to reduce the time required for correcting a pattern layout and to provide a mask layout correction method capable of minimizing distortion of the pattern layout. Moreover, it may also be possible to provide a semiconductor fabrication method capable of minimizing failure of patterns on a wafer that are formed in a single exposure process that uses one photomask.

The aforementioned description provides some example embodiments for explaining the present inventive concepts. Therefore, the present inventive concepts are not limited to the embodiments described above, and it will be understood by one of ordinary skill in the art that variations in form and detail may be made therein without departing from the spirit and essential features of the present inventive concepts.

What is claimed is:

1. A mask layout correction method, comprising:
    performing a first optical proximity correction on an initial pattern layout by:
        providing a target pattern of the initial pattern layout with a plurality of control points based on a first model, said plurality of control points including first control points on an edge of the target pattern, and second control points in an interior of the target pattern;
        obtaining a predicted contour of the initial pattern layout by performing a lithography simulation on the initial pattern layout; and
        obtaining an error between the target pattern and the predicted contour from the plurality of control points, by: (i) acquiring first error values from the first control points, (ii) providing weights to the first error values, and (iii) acquiring second error values from the second control points.

2. The mask layout correction method of claim 1, wherein obtaining the error between the target pattern and the predicted contour further includes obtaining a sum of the weight-added first error values and the second error values as the error between the target pattern and the predicted contour.

3. The mask layout correction method of claim 1, further comprising determining whether the initial pattern layout coincides with specific type pattern layouts stored in a pattern distortion library; and wherein the first optical proximity correction is selectively performed when the initial pattern layout coincides with the specific type pattern layouts.

4. The mask layout correction method of claim 1, further comprising:
    selecting a specific pattern layout from an integrated circuit design layout;
    analyzing a distortion degree of the specific pattern layout;
    providing the specific pattern layout with a marker when the distortion degree exceeds an allowable limit;
    storing the specific pattern layout provided with the marker in a pattern distortion library of a computer; and
    before performing the first optical proximity correction, determining whether the initial pattern layout coincides with the specific pattern layout stored in the pattern distortion library.

5. The mask layout correction method of claim 4, wherein analyzing the distortion degree of the specific pattern layout includes quantitatively analyzing the distortion degree using a specific function having, as operands, a first variable that specifies a distance between central points of neighboring specific pattern layouts and a second variable that specifies an area of a target pattern of the specific pattern layout.

6. The mask layout correction method of claim 5, wherein the distortion degree of the specific pattern layout is: (i) inversely proportional to the distance between the central points of the neighboring specific pattern layouts, and (ii) proportional to the area of the target pattern of the specific pattern layout.

7. The mask layout correction method of claim 4, wherein the first optical proximity correction is selectively performed when the initial pattern layout coincides with the specific pattern layout.

8. The mask layout correction method of claim 1, wherein performing the first optical proximity correction further includes providing the target pattern with a plurality of control points based on a second model when the error between the target pattern and the predicted contour exceeds an allowable limit; and wherein the number of the plurality of control points based on the second model is greater than the number of the plurality of control points based on the first model.

9. The mask layout correction method of claim 8, wherein the first optical proximity correction is repeatedly performed to minimize the error between the target pattern and the predicted contour.

10. The mask layout correction method of claim 8, wherein performing the first optical proximity correction further includes correcting the initial pattern layout based on the first model when the error between the target pattern and the predicted contour is within the allowable limit.

11. A semiconductor fabrication method, comprising:
    correcting a mask layout by:
        selecting an initial pattern layout from an integrated circuit design layout;
        determining whether the initial pattern layout coincides with specific type pattern layouts, which are stored in advance in a pattern distortion library;
        selectively performing a first optical proximity correction on the initial pattern layout when the initial pattern layout coincides with the specific type pattern layouts;
        performing a second optical proximity correction on the initial pattern layout when the initial pattern layout does not coincide with the specific type pattern layouts;
    manufacturing a photomask having mask patterns corresponding to the corrected mask layout;
    performing a photolithography process on a wafer, using the photomask; and
    wherein performing the first optical proximity correction includes providing a target pattern of the initial pattern layout with a plurality of control points based on a first model;
    wherein performing the second optical proximity correction includes providing the target pattern of the initial pattern layout with a plurality of control points based on a second model; and
    wherein the number of the plurality of control points based on the first model is greater than the number of the plurality of control points based on the second model.

12. The semiconductor fabrication method of claim 11, wherein performing the first optical proximity correction further includes:

obtaining a predicted contour of the initial pattern layout by performing a lithography simulation; and obtaining an error between the target pattern and the predicted contour from the plurality of control points based on the first model;

wherein the plurality of control points include first control points provided on an edge of the target pattern and second control points provided in an interior of the target pattern, and wherein obtaining the error between the target pattern and the predicted contour includes acquiring first error values from the first control points, providing weights to the first error values, and acquiring second error values from the second control points.

13. The semiconductor fabrication method of claim 12, wherein obtaining the error between the target pattern and the predicted contour further includes obtaining a sum of the weight-added first error values and the second error values as the error between the target pattern and the predicted contour.

14. The semiconductor fabrication method of claim 12, wherein performing the first optical proximity correction further includes providing the target pattern with a plurality of control points based on a third model, when the error between the target pattern and the predicted contour exceeds an allowable limit; and wherein the number of the plurality of control points based on the third model is greater than the number of the plurality of control points based on the first model.

15. The semiconductor fabrication method of claim 12, wherein performing the first optical proximity correction further includes correcting the initial pattern layout based on the first model when the error between the target pattern and the predicted contour is within an allowable limit.

16. The semiconductor fabrication method of claim 11, further comprising:

selecting a specific pattern layout from the integrated circuit design layout;

analyzing a distortion degree of the specific pattern layout;

providing the specific pattern layout with a marker when the distortion degree is out of an allowable limit; and storing the specific pattern layout provided with the marker in the pattern distortion library.

17. The semiconductor fabrication method of claim 16, wherein analyzing the distortion degree of the specific pattern layout includes quantitatively analyzing the distortion degree using a specific function having, as operands, a first variable associated with a distance between central points of neighboring specific pattern layouts and a second variable associated with an area of a target pattern of the specific pattern layout.

18. The semiconductor fabrication method of claim 17, wherein the distortion degree of the specific pattern layout is inversely proportional to the distance between the central points of the neighboring specific pattern layouts and is proportional to the area of the target pattern of the specific pattern layout.

19. A mask layout correction method, comprising:

selecting an initial pattern layout from an integrated circuit design layout;

determining whether the initial pattern layout coincides with one of specific type pattern layouts stored in a pattern distortion library; and performing a first optical proximity correction on the initial pattern layout only when the initial pattern layout coincides with one of the specific type pattern layouts, by:

providing a target pattern of the initial pattern layout with a plurality of control points based on a first model;

obtaining a predicted contour of the initial pattern layout by performing a simulation; and obtaining an error between the target pattern and the predicted contour from the plurality of control points;

wherein the plurality of control points include first control points provided on an edge of the target pattern and second control points provided in an interior of the target pattern; and wherein obtaining the error between the target pattern and the predicted contour includes acquiring first error values from the first control points, and providing weights to the first error values.

* * * * *